United States Patent [19]
Dillow

[11] Patent Number: 4,740,125
[45] Date of Patent: Apr. 26, 1988

[54] METHOD AND APPARATUS FOR ADJUSTING THE BINDING BACK MARGINS, ESPECIALLY FOR SEW-STITCHED, WIRE-STITCHED AND BLOCK STITCHED MAGAZINES

[75] Inventor: Brian Dillow, Vallingby, Sweden

[73] Assignee: Misomex AB, Sweden

[21] Appl. No.: 926,360

[22] Filed: Oct. 31, 1986

[30] Foreign Application Priority Data

Nov. 26, 1985 [SE] Sweden ............................ 8505579

[51] Int. Cl.⁴ ............................................ B42D 15/00
[52] U.S. Cl. ........................................ 412/1; 283/1 R
[58] Field of Search ............................ 412/1; 283/1 R

[56] References Cited

U.S. PATENT DOCUMENTS 4,073,510 2/1978 Scharlin ................................ 412/1

Primary Examiner—Paul A. Bell

[57] ABSTRACT

A method and an apparatus for adjusting the binding back gauge (measurements) for printed matters, especially bulky type newspapers or magazines or other types of back sew-stitched, wire-stitched, adhesive bound, for instance adhesive block bound printed matters manufactured from film originals (7', 7") containing text and picture blocks in a given standard layout on the film original, whereby the films corresponding to the pages of the printed matter which are located in advance of or after the central spread of each unit of print section or unit of combined print sections are provided displaced in the direction towards the back line (8) of the printed matter to be made or away from said back line respectively. In pictures which at least in part extend over the two pages of a spread the original films can be duplicated, whereby one (7') of the original films, the left one, is cut a distance to the right of the back line (8) and the other one, the right original film (7"), is cut a distance to the left of the back line (8), whereupon the films are copied together edge to edge on the printing plate with the doubled picture portions facing the back of the printed matter.

7 Claims, 3 Drawing Sheets

METHOD AND APPARATUS FOR ADJUSTING THE BINDING BACK MARGINS, ESPECIALLY FOR SEW-STITCHED, WIRE-STITCHED AND BLOCK STITCHED MAGAZINES

The present invention relates to a method and an apparatus for adjusting the binding back margins when preparing originals for printing plates for printed matters, especially sew-stitched, wire-stitched and block stitched printed matters. The invention is of special interest and is especially useful for printed matters like magazines or periodicals books and similar printed matters containing text or pictures and other units which at least in parts extend over a double page (spread).

When producing printed matters normally 18, 16 or 32 pages are printed on one and the same sheet and are folded together to an 8-, 16- or 32-page folded print section. In order to have the pages follow a correct order in the folded print section they are placed in position in a certain order in the printing plate so that one side of a for instance 16-page sheet are printed with the pages 16, 1, 4, 13, 12, 5, 8 and 9, and on the second side of the sheet pages 14, 3, 2, 15, 10, 7, 6 and 11 are printed. The central double page or spread contain pages 8 and 9, and said pages are the only subsequent pages on the printing plate which are placed adjacent each other and the only spread on which a picture can be printed which at least partly extend over two pages without the need of splitting the film original and mounting the film halves separated from each other. 32-page print sections only pages 16–17 are located adjacent each other on the central spread.

When binding the printed matter actual number of folded print sections are placed on top of each other or are put into each other at the central spread and are joined by means of sew-stitching, wire stiching or by adhesive binding. In the last mentioned case the back of the layers of folded print sections are cut straight through some millimetres from the back, and the sections are glued together along the back cutting. In some extreme cases folded sheets are stitched by means of wire stitches provided a couple of millimeters inside the back of the printed matter.

In many cases newpapers etc. are stitched in that several folded sheets are put into each other so that the central spread of sheet II is placed over the back of sheet I etc. By this method it is possible to provide bulky printed matter in which the pages of the central spread, for instance pages 63–64 in an 128-page folder extend substantially longer sideways than the outermost two leaves 1–2 and 127–128. When the foler is then cut at the outer edge a larger part of the outer edges are cut away in the sides close to the central spread than in the pages provided earlier or later, see FIG. 1, and for this reason the text appears successively displaced sideways on the pages, namely so that the earlier and later pages, as seen from the central spread, appear placed successively closer to the back. This problem can partly be solved by compensating for this imaginary side displacement already in connection to the impositioning of the printed section, but this is complicated and time consuming and is not suitable when using modern machines for preparing the printing plates and printing forms, and further careful information from the reproduction department is needed. In some cases it is possible to start from average value and to accept that the pages close to the central spread are placed too far out and the pages close to the beginning and the end are placed too close to the back, but also this compromise does not give a sufficiently attractive result.

Whether the printed sections are sew stitched, wire stitched or adhesive bound, the same type of problems appear, which are especially noticable in pictures etc. which extend completely or partly over a spread, except for the pictures of the central spread in which the pages are integral with each other. The problem in overhanging pictures also depend on the difficulty of completely folding up a spread located in front of or behind the central spread. When adhesive gluing or block binding of the printed matter a successively increasing part of the pages at the back also are cut away before the adhesive binding or glue binding, so that parts of pictures etc. may be cut away. A spread of for instance pages 2–3 or 14–15 in a 16-page fold sheet therefore may show a picture which is in lack of some parts at the joint between the pages.

It may in some cases be desired to move text- and picture films together or apart, or both together and apart, in spreads in order that the text and the pictures in the ready printed matter are placed centrally on the page, and this may be actual at the beginning and at the end of the printed matter. In other cases or concurrently therewith it may also be desired to move the pages apart on pages far from the central spread so that pictures or text extending over a complete spread shall appear as an entire and integral unit.

It has been suggested that the picture parts in such "spread pictures" be displaced slightly to the outer edge of the page so that the spread gives a complete picture and an imaginary view of an integral picture. This method is called adjustment of the binding back measurement. It is, however necessary that the printing office has its own reproduction department which can consider this problem. In many cases the film originals are delivered formed with register holes and ready for being mounted and printed, generally in the form of film containing text and pictures for two pages of a spread, and in such cases it may be difficult and it may cause problems to readjust the impositioning of the pictures or the so called binding back gauge. The method also causes problems in that the pages show a white edge adjacent the back if the spread pages are fold up very far or that a white edge appears on one of the pages if the picture is viewed obliquely from the side.

The basic problem of the invention therefore has been to provide a method and an apparatus by means of which it is possible by a simple method to adjust the binding back measurement of print pages, especially for stitched or adhesive bound printed matters like newspapers, magazines and periodicals, so that text and pictures appear in a desired side position of the ready printed matter, and so that special consideration also is taken to pictures which at least in parts extend over two pages of a spread. According to the invention the problem is solved already when making the final text and picture films by foreseeing that the text and the pictures respectively of certain pages are displaced in a direction away from the back or in the direction towards the back, or sometimes both, whereby the so called binding back gauge is adjusted so that the text of the ready printed matter seems to be placed centrally on the page. A special aspect of the invention is that each combined film original which has to be split for being printed onto pages of a spread, except for the pages of the central spread, are presented in two like copies, whereby one copy, which is to provide the left part of the picture is cut a predetermined distance right of the fold line of the sheet to be folded, and the second copy, which is to provide the right part of the picture is cut a like large distance left of the subsequent fold line, whereupon the picture films are mounted without being moved out from the back line, so that the binding back measurement is automatically corrected and the pages can be reproduced in pairs without any consideration taken to the binding back measurement. Since the pages thereby provided and printed the white strip which otherwise would appear at the back is elminated, and the combined pictures appears complete and integral at any view angle and even if the newspaper, the magazine or the book cannot be open to a complete open spread. When binding the printed matter by adhesive binding, whereby a certain part of the page is cut off at the back before applying the adhesive only the doubled part of the picture is cut off so that the combined picture still remains complete.

Now the invention will be described more closely with reference to the accompanying drawings, which illustrate an example of adjusting of the binding back measurement according to the invention.

FIG. 1 diagrammatically illustrates two fold 16-page print sections and how to displace the pictures in order to obtain the best position in the ready printed matter.

Figure 1:
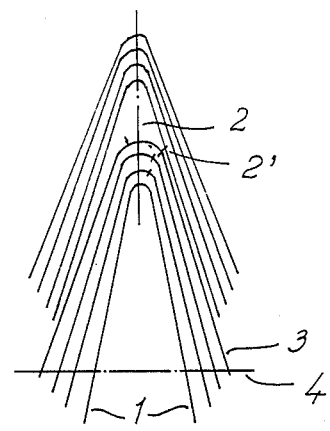
Figure 2:
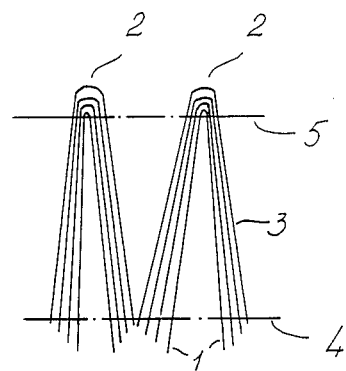
FIG. 2 illustrates similarly the method in connection to adhesive binding to two 16-page fold print sections.

FIG. 1 diagrammatically shows two 16-page fold sections, one introduced in the central spread of the other and the figure exaggeratively illustrates how the leaves 1 of the central spread, that is pages 7-10 of the printed matter, extend some longer distance out from the back 2, than the leaves closer to the beginning and the end of the printed matter, that is pages 1-2 and 15-16. When the printed matter is cut clean along the line 4 text and pictures on some of the pages seem to be placed to close to the back or alternatively to far out from the back. The problem can be solved either by successively displacing the text and the picture blocks of the pages in front of and behind the central spread outwards (push-out) as indicated with 2' in the figure, or oppositely that the text and picture blocks are successively moved inwards as seen from the outer leaves 3 to the central spread 1. FIG. 2 shows how a double corresponding problem appears in connection to adhesive binding or block binding, viz. firstly depending on the clean cutting of the back along the line 5 before the application of adhesive, and secondly depending on the clean cutting of the outer edges along the line 4 subsequent to the binding operation. Thus in this case the text block is side displaced in some of the pages, and in addition thereto parts of such pictures which extend over a spread are cut off when the back is cut clean.

The problem can be favourably solved by the method according to the invention, which in the case (A) with push in of the text blocks from the back and in the case (B) whith push out of the text blocks from the back include four method steps. In both cases the same relatively simple equipment is used, which equipment can be available in all printing shops.

Normally the text material is provided on original films containing two pages corresponding to a complete spread, whereby the films are split in connection to the mounting and are laid in an impositioning machine which places the films on the exact place according to a predetermined lay-out, whereupon the films are copied to a printing plate. In order to allow a mechanized handling of the original films, and in order to have the text and picture blocks fall exactly on a desired place of the printing plate the original films are formed with punched holes, and they are divided into two parts, one of which forms the left page of a spread and the other forms the right page, generally of another spread. The dividing or split of the films is made in a specific way according to the invention, so that the text and picture blocks fall exactly on the intended place on the ready and cut clean newspaper or periodical, and so that picture extending over both sides of a spread come together and form a unit without any intermediate breaking in the form of a non-printed strip or without any cut off parts at the back.

STEP 1 (FIG. 3)

Figure 3:
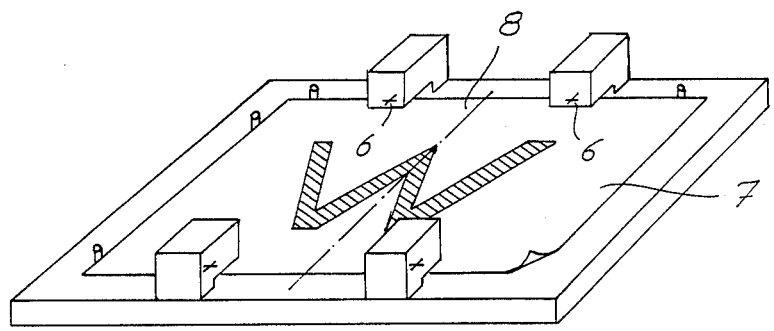
FIGS. 3, 4, 5, 6, 7 and 8 illustrate 6 different steps of the method according to the invention.

For making it possible to accurately handle the text and picture films, the so called film originals they are as usual formed with punch holes 6. The punch holes can be made in any suitable punch, for instance in a punch machine of the type shown in FIG. 3. Such a punch machine can be used both for original films in the form of a complete spread or a double page as for films for separate pages. If needed the punch also can be used for punching of a collection film onto which the film originals are subsequently mounted. FIG. 3 shows an original spread film 7 in which the central line between the pages corresponding to the back of the printed matter is marked with the dotted line 8. In this case it is presupposed that the text and the pictures of the film are placed in an exact basic position on the film. In other cases a collection film is punched, and on said collection films the original text and picture films are later mounted in the desired position, and in the following the set up comprising the collection film and the original films mounted thereon is handled.

STEP 2 (FIG. 4)

Figure 4:
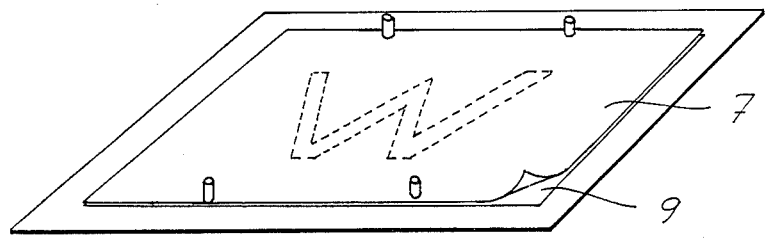

If the text and the pictures are localized in a position on the original films which is the intended position for the ready printed matter, there is no pre-treatment of the films but for providing punch holes, for instance punch holes for a machine for placing and eventuelly copying of the films directly to a printing plate. This situation is actually in the first place for the central double page (spread) and for the first and the last page of the printed matter. If the text and the pictures are provided in separate units said units are mounted according to a predetermined lay-out on a collection film 9 or on a grid film. In other cases the printing back gauge is adjusted by a push in or a push out of text and pictures or possible both push in and push out at the same time for the above mentioned purpose. This may also be actual for the set-up which is made from separate text and picture films. In case of push in (C of FIG. 9) and normal push out (B of FIG. 9) the method is prosecuted directly in step 3. In case of push out with overlapping of the picture at the back (A of FIG. 9) the original film must be pesent in a duplicate or it must be copied which can for instance be made by a simple copying equipment on a film which is punched exactly like the original film, whereby an identical duplicate is obtained of the original film. This is likewise symbolized in FIG. 4.

Figure 5:
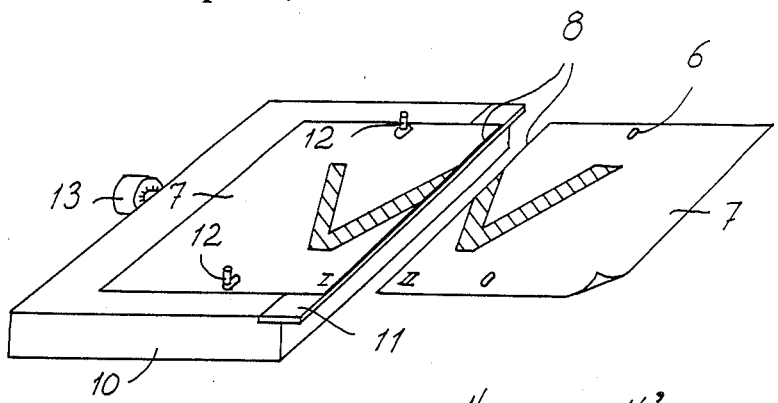
Figure 6:
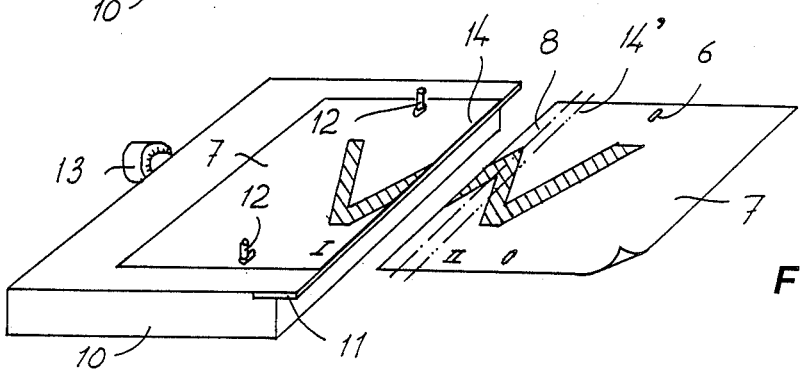
Figure 7:
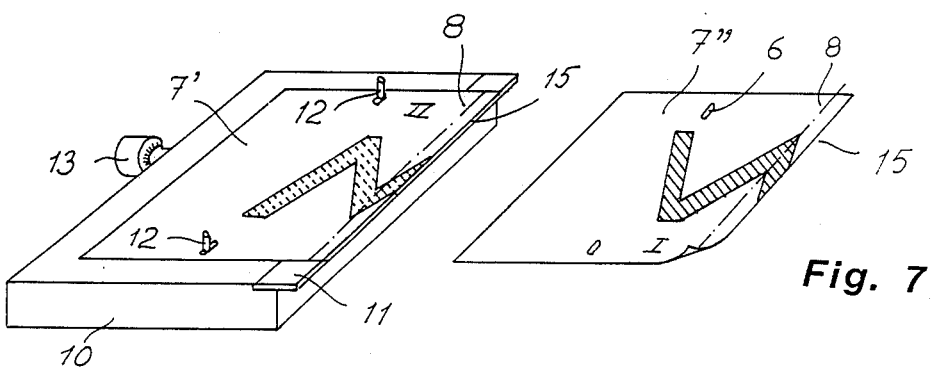

STEP 3 (FIGS. 5, 6 and 7)

A cutting table 10 having a cutting edge 11 and two registered pins 12 is used for splitting the films. The size and mutual distance between the registered pins exactly corresponds to the punch holes 6 made according to step 1. The registered pins are mounted on a (not illustrated) slide, which can be moved at right angle to the cutting edge 11 and the position of which can be accurately controlled by means of a micrometer screw 13. The screw 13 is marked with a normal position which exactly corresponds to the non-adjusted binding back gauge in which consequently the central line 8 of the double page is located exactly at the outer edge of the cutting edge 11 and from which a push in can be made, for instance 2 mm or more, and from which a push out of the original film can be made, for instance 6 mm or more.

Figure 9:
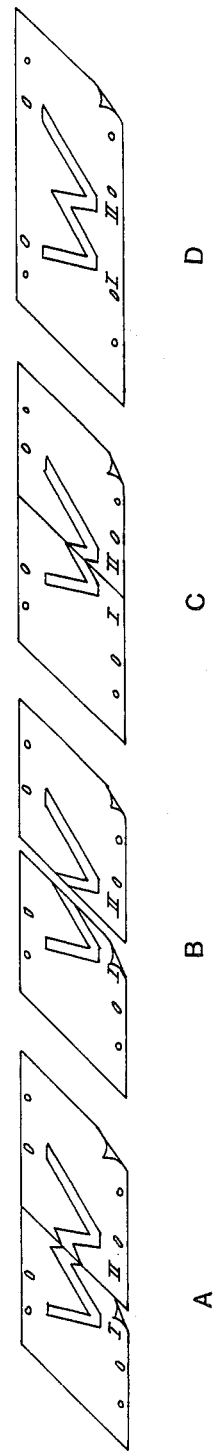
FIG. 9 is a diagrammatically combined illustration of how to adjust the binding back measurements by a specific design of the film originals or the reproduction films.

In some cases, for instance at the central double page or spread the original film can be used non-splitted (D in FIG. 9), in other cases it is desired to push in the text and picture blocks towards the back (C of FIG. 9) in still other it is desired to push out the text and the pictures without overlapping parts at the back (B of FIG. 9), and in still further cases it is desired to push out the text and the pictures with an overlapping at the back (A of FIG. 9).

Figure 8:
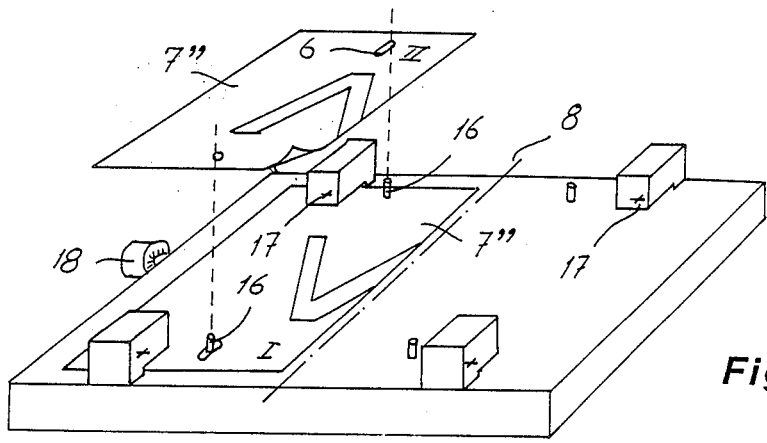

In case of push in, which is illustrated in FIG. 6 the sole original film 7 is placed on the registered pins 12 with its punch holes 6, and the control screw 13 is rotated so that the film is pushed in a calculated distance towards the cutting edge 11, and the film is cut, for instance along the line 14 (_ . . . ) of FIG. 6. The remaining part I now is ready for being placed in the impositioning machine. The cut off part II is rotated 180° and is with its punch holes placed on the register pins 12, and without changing the position of the control screw 13 also this film part is cut, now according to line 14'. The two films I and II now have been cut off an exactly large distance at the back of the printed matter to be made, and when moving said films into edge to edge contact (C of FIG. 9) the films are placed so that the text and pictures fall exactly on the intended position on the page. As mentioned above a push in can be actual for the pages closest to the central spread, for instance pages 5–7 and 10–12 of a 16-page print section. The central spread is kept without any change. In case of push out without overlapping parts, which can be considered the most usual case, the original film is split into two like parts along the central line 8 as illustrated in FIG. 5, and said parts are separated a predeteremind distance from each other and are repunched as will be further explained in connection to FIG. 8.

In case of push out with overlapping of the picture at the back, which case is illustrated in FIG. 7, two exactly like original films 7' and 7" are used, which are made according to step 2. The first film 7 is with its punch holes 6 placed on the register pins 12, and the pins are moved from the cutting edge 11 a desired distance and the film is cut along line 15. The cut off part of the film is removed. The second film 7' is rotated 180° as illustrated in FIG. 7 and is likewise placed on the register pins 12 and is cut exactly as the film 7'. Thereby a first film I with an even page number and a second film II with an uneven page number have been obtained, which are both pushed out some distance from the back of the printed matter to be made, and which each have an overlappning part between the central line 8 and the outer edge 15.

STEP 4 (FIG. 8)

The original films made as described above are repunched for the specific register system which is used in the actual impositioning or lay out machine. For this purpose it is possible to use a punch table of the type shown in FIG. 8, which is basically of the same type as the punch table of FIG. 2, but which is formed with registered pins 16 corresponding to the punch hole 6 of the original films and with punches 16 for punching holes for the specific impositioning machine. Also in this case the register pins 16 are mounted on a slide (not illustrated) which is displacable by the actuation of a control screw 18 of the micrometer type, so that the second set of punch holes can be made exactly for the actual push in or push out. At this moment there is, of course, also a possibility of re-adjusting the push in or push out.

The control screw 18 preferably is scaled from a zero-line, and when repunching pushed in films the screw is adjusted to a specific minus-value so that the film parts having the cut off back parts (C of FIG. 9) are punched for edge to edge contact. For pushed out films, whether said films have overlapping parts (A of FIG. 9) or not (B of FIG. 9) the screw is adjusted to an actual positive push out measurement. For film parts having overlapping portions the films are provided edge to edge, in case of non-overlapping portions the films are mounted slightly spaced from each other. FIG. 9 shows the four basic types of original films which are to be handled by the impositioning machine, namely pushed out films having overlapping portions, B split and pushed out films without an overlapping portions, C pushed in films having cut off back portions and D a complete and unchanged double page or spread.

The films A are used in the first hand in bulky printed matters for pages located far from the central double page or spread, for instance pages 2–3 or 14–15 of a 16-page print section, especially in case there are great demands on print quality, for instance in advertisings or picures extending over two pages of a spread; the films B, in turn, are used in corresponding cases where there are no overhanging pictures or text portions or where there are no specific high demands on print quality; the films C are used in the first hand for pages close to the central spread, for instance for pages 5–7 and 10–12 of a 16-page print section; the films D are used for the central spread.

In many cases masks are used for providing special copying effects as wellknown to the experts, and in the above specification such use of masks has not been described.

There are of course possibilities of varying the push in and the push out according to wish and need and it is possible to combine pushed in and pushed out film pages.

It is to be understood that the invention is not restricted to the illustrated and described method steps and apparatus, and that the invention can be modified, changed and combined with other steps and apparatus known in this technical field and as obvious to the expert and within the scope of the appended claims.

I claim:

1. Method for adjusting the binding back measurement for printed matter of the general bulky type manufactured from film originals (7, 7', 7") containing text and picture blocks in a given standard layout on the film original, said printed matter comprising magazine, back sew-stitched, wire-stitiched and adhesive bound including adhesive block bound printed matters, said method comprising the steps of:

providing the film originals for the pages located before and after the central spread of each unit of print section or combination of print sections in a displaced orientation in a direction toward and away from the back line (8) of the matter to be printed, respectively.

2. Method for adjusting the binding back measurement as defined in claim 1 further including the step of:

displacing the text and picture mass of a number of pages located within the pages near the central double page inwardly toward the back of the print to be printed thereby reducing the measurement for the back binding for said number of pages up to 2 millimeters per page.

3. Method for adjusting the binding back measurement as defined in claim 1 further including the step of:

displacing the text and picture mass of a number of pages located within the pages furthest from the central double page of each print section or combination of print sections outwardly away from the back of the print to be printed thereby increasing the measurement for the back binding for said number of pages up to 6 millimeters per page.

4. Method for adjusting the binding measurement as defined in claim 3 wherein the step of displacing the text and picture mass outwardly further includes:

splitting the film original (7', 7") into two parts when the text and picture mass comprises two pages per film, said two pages corresponding to a double page spread of the printed matter, said step of splitting further indlucing making a cut (15) extending substantially parallel with said central back line 8 and the right of said cut to cut one film (7') and making a cut extending substantially parallel with said central back line 8 and to the left of said cut to cut the other film (7") of said film original, removing the cut portions of said one and other film, and placing said one and other film (7', 7") adjacent with each other to print the print section.

5. Method for adjusting the binding measurement as defined in claim 1 wherein the step of displacing the text and picture mass inwardly further includes:

splitting the film original into two parts when the text and picture mass comprises two pages per film, said two pages correspondng to a double page spread of the printed matter, said step of splitting further indlucing making two cuts (14, 14') along the central line (8) of the film, one cut extending slightly to one side of the central line and the other cut extending slightly to the other side of the central line whereby an intermediate portion of the film is removed.

6. Method for adjusting the binding measurement as defined in claim 1 further including the steps of:

forming punch holes (6) in the film originals (7, 7', 7");

mounting the film originals in a cutting machine (10) having register pins (12) spaced from one another at a spacing corresponding to the spacing of said punch holes (6) and located along a line at a right angle to the cutting edge (11);

moving the mounted films a predetermined distance in one and the other direction;

cutting the film, and placing the cut films directly in an impositioning machine means having similar registration pin locations corresponding to said punch holes for copying the films to a printing plate.

7. Apparatus for carrying out the method of claim 6, said apparatus comprising:

a cutting table (10) having a cutting edge (11) and register pins (12) spaced from one another a distance corresponding substantially to the spacing of the punch holes (6) of said film originals, said register pins lying along a line at a right angle of said cutting edge (11) of said cutting table, adjustment means for moving the film original substantially parallel with the binding back line (8) in a direction toward and away from the binding back of the printed matter to be made, said adjustment means comprising an adjustment screw (13).

* * * * *